(12) United States Patent  
Shi et al.

(10) Patent No.: US 7,930,011 B2
(45) Date of Patent: Apr. 19, 2011

(54) HOUSING ASSEMBLY FOR ELECTRONIC DEVICE

(75) Inventors: Zheng Shi, Shenzhen (CN);
Chih-Chiang Chang, Taipei Hsien (TW); Pao-Chun Lin, Taipei Hsien (TW)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 171 days.

(21) Appl. No.: 12/142,013

(22) Filed: Jun. 19, 2008

(65) Prior Publication Data

US 2009/0244819 A1  Oct. 1, 2009

(30) Foreign Application Priority Data

Mar. 26, 2008  (CN) .......................... 2008 1 0300710

(51) Int. Cl.
*H04M 1/00* (2006.01)
(52) U.S. Cl. ................. 455/575.8; 206/320; 379/433.11
(58) Field of Classification Search .................. 206/320; 379/428.01, 428.04, 433.11, 434; 455/575.1, 455/575.8; 361/679.3; D3/201, 218, 269; D14/250
See application file for complete search history.

(56) References Cited

U.S. PATENT DOCUMENTS

| | | | | |
|---|---|---|---|---|
| 5,768,370 | A | * | 6/1998 | Maatta et al. ............ 379/433.01 |
| 5,982,881 | A | * | 11/1999 | Mischenko ............. 379/433.11 |
| 6,574,098 | B2 | * | 6/2003 | Netzel et al. ............ 361/679.3 |
| 6,809,921 | B2 | * | 10/2004 | Wu et al. ............... 361/679.56 |
| 6,842,633 | B1 | * | 1/2005 | Deo et al. .................. 455/575.8 |
| 7,194,291 | B2 | * | 3/2007 | Peng ........................ 455/575.8 |
| 7,343,184 | B2 | * | 3/2008 | Rostami .................... 455/575.8 |
| D575,056 | S | * | 8/2008 | Tan ............................... D3/218 |
| 2002/0159586 | A1 | * | 10/2002 | Chiou ...................... 379/433.11 |
| 2003/0151890 | A1 | * | 8/2003 | Huang et al. ................. 361/683 |
| 2004/0097276 | A1 | * | 5/2004 | Harmon .................... 455/575.1 |
| 2004/0109560 | A1 | * | 6/2004 | Nuovo et al. ................ 379/440 |
| 2004/0204169 | A1 | * | 10/2004 | Goradesky ............... 455/569.1 |
| 2005/0022924 | A1 | * | 2/2005 | Blackburn ................... 156/230 |
| 2008/0185300 | A1 | * | 8/2008 | Lacey et al. .................. 206/38 |

FOREIGN PATENT DOCUMENTS

CN  1494370 A  5/2004

* cited by examiner

*Primary Examiner* — J. Gregory Pickett
(74) *Attorney, Agent, or Firm* — Steven M. Reiss (57) ABSTRACT

A housing assembly (10) and a portable electronic device (100) using the housing assembly is provided. The housing assembly includes a main body (12), a first decorative member (14), and a second decorative (16). The first decorative member has a first appearance, and the first decorative member (14) is mounted to the outer wall of the main body. The second decorative member (16) has a second appearance that is different from the first appearance, and the second decorative member (16) is mounted to the outer wall of the main body (16). The portable electronic device (100) further includes an another housing assembly. The housing assembly is assembled with another housing assembly).

13 Claims, 11 Drawing Sheets

FIG. 11

HOUSING ASSEMBLY FOR ELECTRONIC DEVICE

BACKGROUND

1. Field of the Invention

The present invention relates to housing assemblies, particularly to housing assemblies used in portable electronic devices.

2. Description of Related Art

With the development of wireless communication and information processing technology, portable electronic devices, such as mobile telephones and electronic notebooks are now in widespread use. External appearance of the housing of the portable electronic device is one of the key factors for attracting consumers.

Surface treatment technology (e.g., plating, vacuum evaporation, or paint coated) is often implemented to achieve an attractive external appearance. However, it is difficult to perform two different surface treatments at the same time, in which the housing simultaneously has two distinct appearances respectively treated by the two surface treatment technologies. More specifically, when the housing is first electroplated and then painted, the paint may cover the plating, whereby the outer housing has only one appearance corresponding to the paint.

Therefore, there is room for improvement within the art.

BRIEF DESCRIPTION OF THE DRAWINGS

Many aspects of the present portable electronic device can be better understood with reference to the following drawings. These drawings are not necessarily drawn to scale, the emphasis instead being placed upon clearly illustrating the principles of the present keypad assembly and portable electronic device. Moreover, in the drawings like reference numerals designate corresponding parts throughout the several views. Wherever possible, the same reference numbers are used throughout the drawings to refer to the same or like elements of an embodiment.

DETAILED DESCRIPTION OF THE EXEMPLARY EMBODIMENTS

Exemplary embodiments will now be described in detail below and with reference to the drawings.

The present housing assembly is suitably used in a portable electronic device, such as a mobile phone, a digital camera, and so on.

Figure 1:
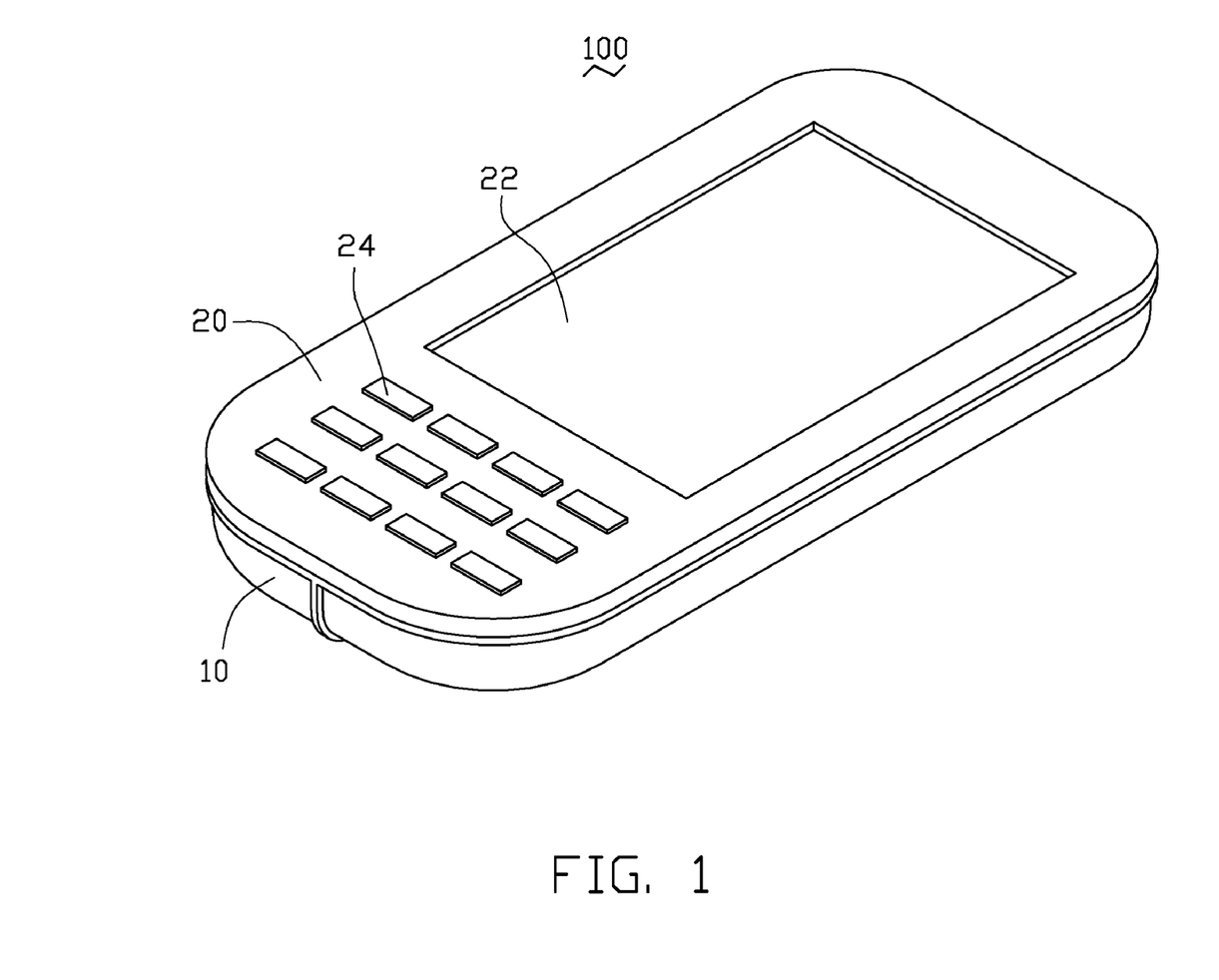
FIG. 1 is an isometric view of a portable electronic device incorporating a housing assembly in accordance with an exemplary embodiment.

Referring to FIG. 1, a mobile phone 100 including a first housing assembly 10 and a second housing assembly 20 located opposite to the first housing assembly 10. The first housing assembly 10 is assembled with the second housing assembly 20. The second housing assembly 20 may include a display unit 22 and/or keypad 24.

Figure 2:
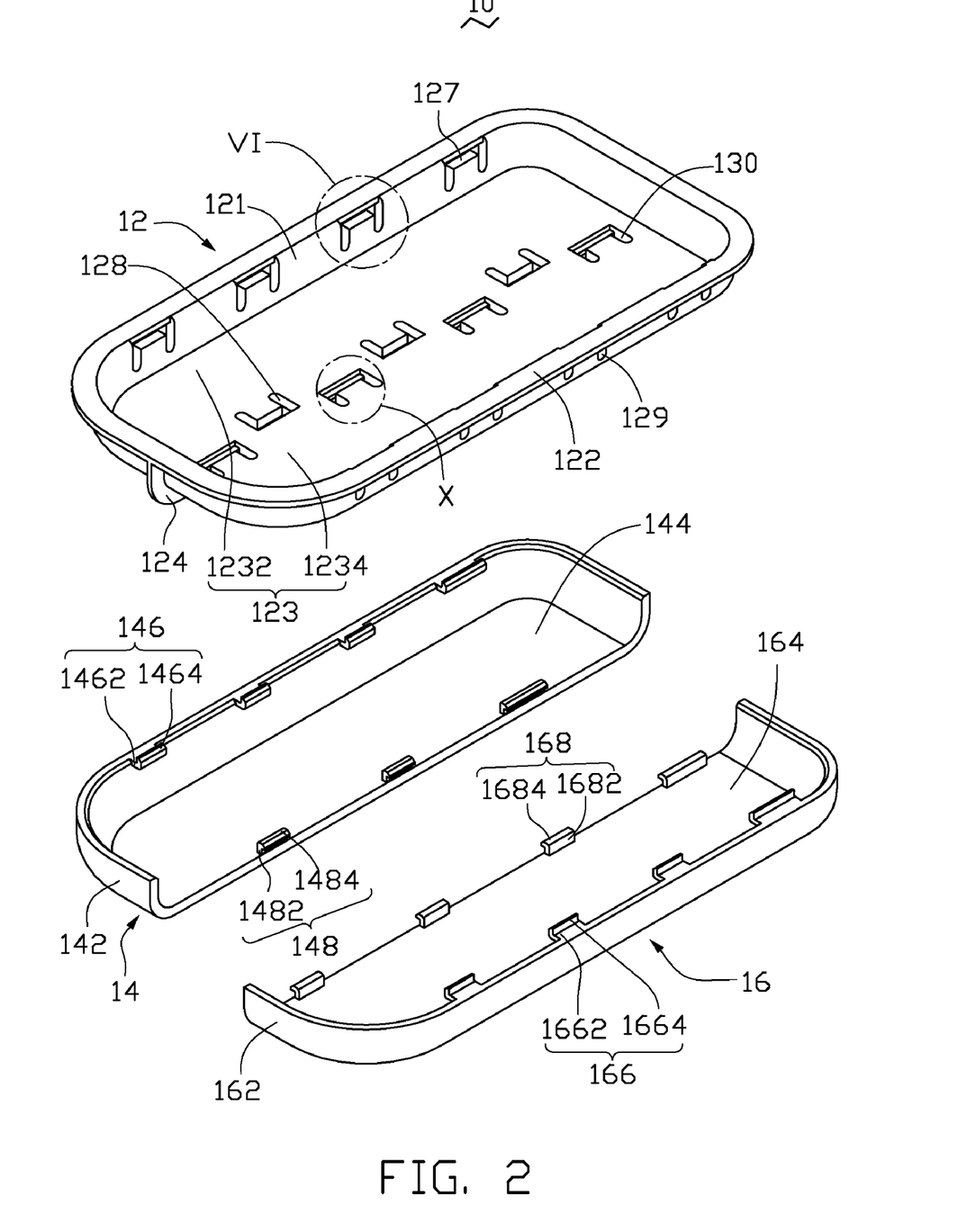
FIG. 2 is an exploded view of a portion of the housing assembly shown in FIG. 1.
Figure 3:
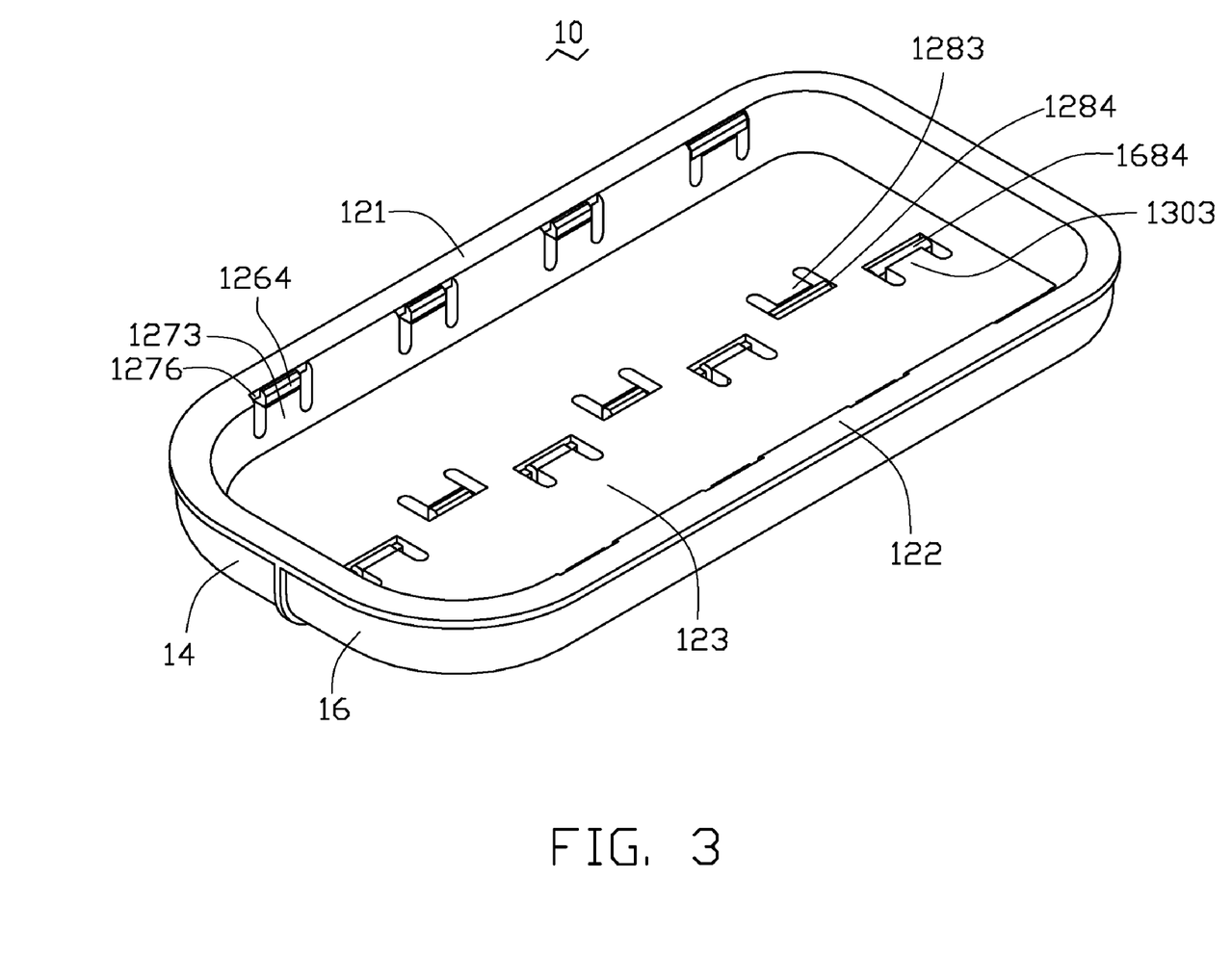
FIG. 3 is an assembled view of the portion of the housing assembly shown in FIG. 2.

Referring to FIGS. 2 and 3, the first housing assembly 10 includes a main body 12, a first decorative member 14, and a second decorative member 16. The first decorative member 14 and the second decorative member 16 are mounted to the main body 12.

The main body 12 is generally rectangular and includes a first sidewall 121, a second sidewall 122, and a bottom wall 123. The first sidewall 121 protrudes from an end of the bottom wall 123, and the second sidewall 122 protrudes from another end of the bottom wall 123. The first sidewall 121 may be parallel with the second sidewall 122.

The main body 12 has a rib 124 protruding from an outside wall (not labeled) thereof. The rib 124 divides the main body 12 into a first housing portion 1232 and a second housing portion 1234. The first housing portion 1232 is located adjacent to the first sidewall 121, and the second housing portion 1234 is located adjacent to the second sidewall 122.

The first sidewall 121 of the main body 12 defines a plurality of first engaging holes 127 therein. Each of the first engaging holes 127 accommodates portions of the first decorative member 14 therein.

Figure 6:
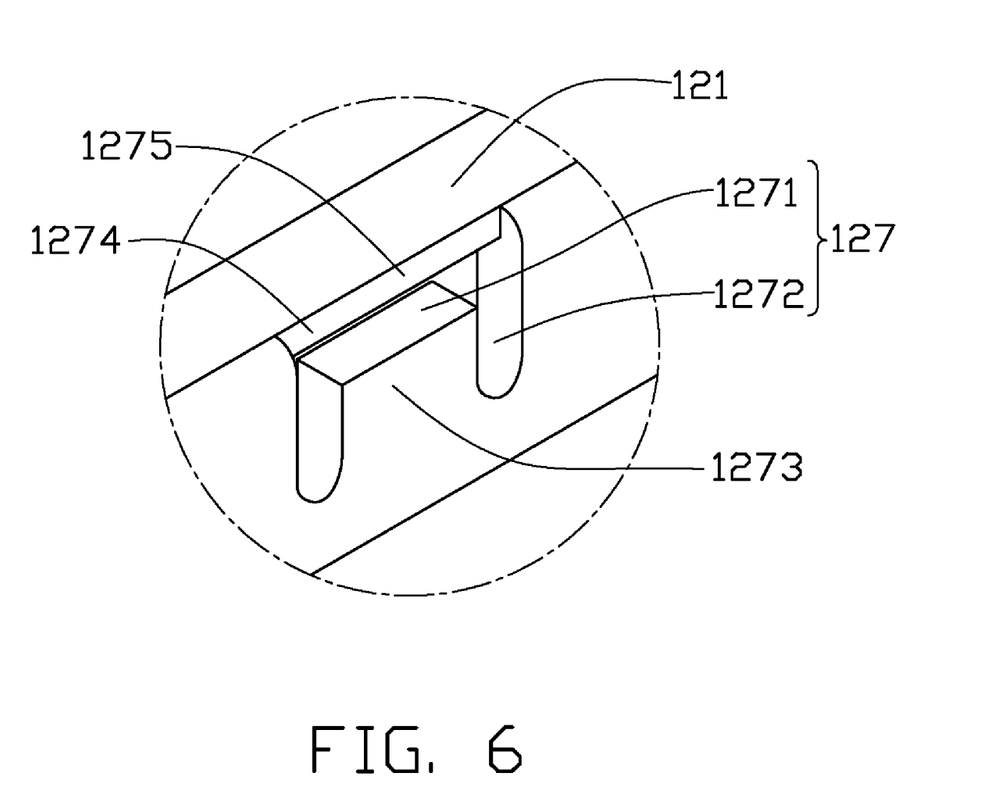
FIG. 6 is a partial enlarged view of the main body in FIG. 5, showing a second engaging hole thereof.

Referring further to FIG. 6, each of the first engaging holes 127 includes a first positioning slot 1271 and two first accessory holes 1272. The two first accessory holes 1272 communicate with the first locating slot 1271. The two first accessory holes 1272 are symmetric, and a plurality of first warping portions 1273 are formed on the first sidewall 121. The first sidewall 121 has a plurality of first securing grooves 1274 defined therein. Each first securing groove 1274 is located opposite to a first warping portion 1273 and communicates with a first locating slot 1271. Each first securing groove 1274 accommodates portions of the first decorative member 14 therein (Referring to FIG. 11).

The bottom wall 123 of the first housing portion 1232 of main body 12 has a plurality of second engaging holes 128 defined therein. Each second engaging hole 128 accommodates portions of the first decorative member 14 therein.

Figure 5:
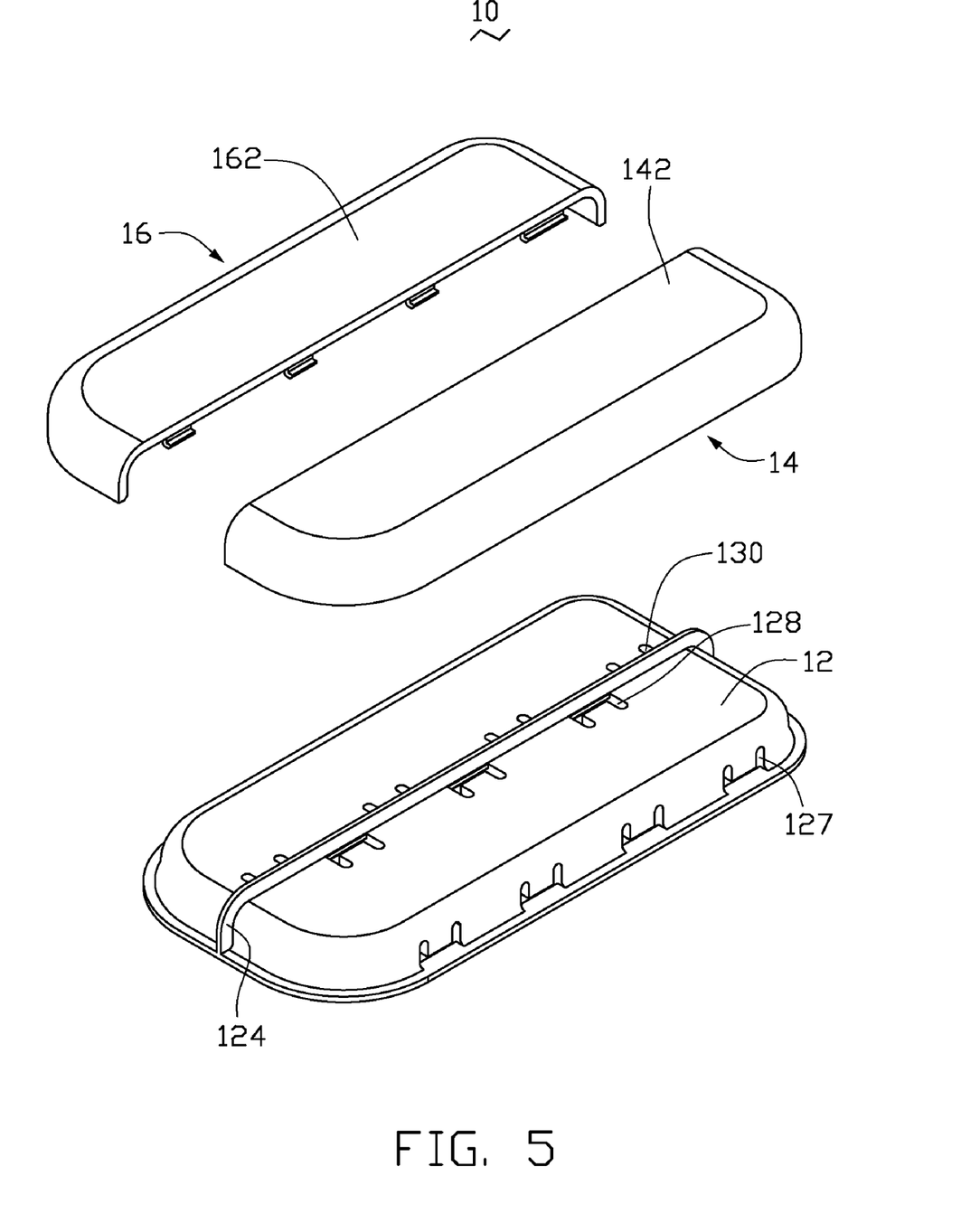
FIG. 5 is an partial enlarged view of the housing assembly shown in FIG. 2, showing a main body thereof.
Figure 8:
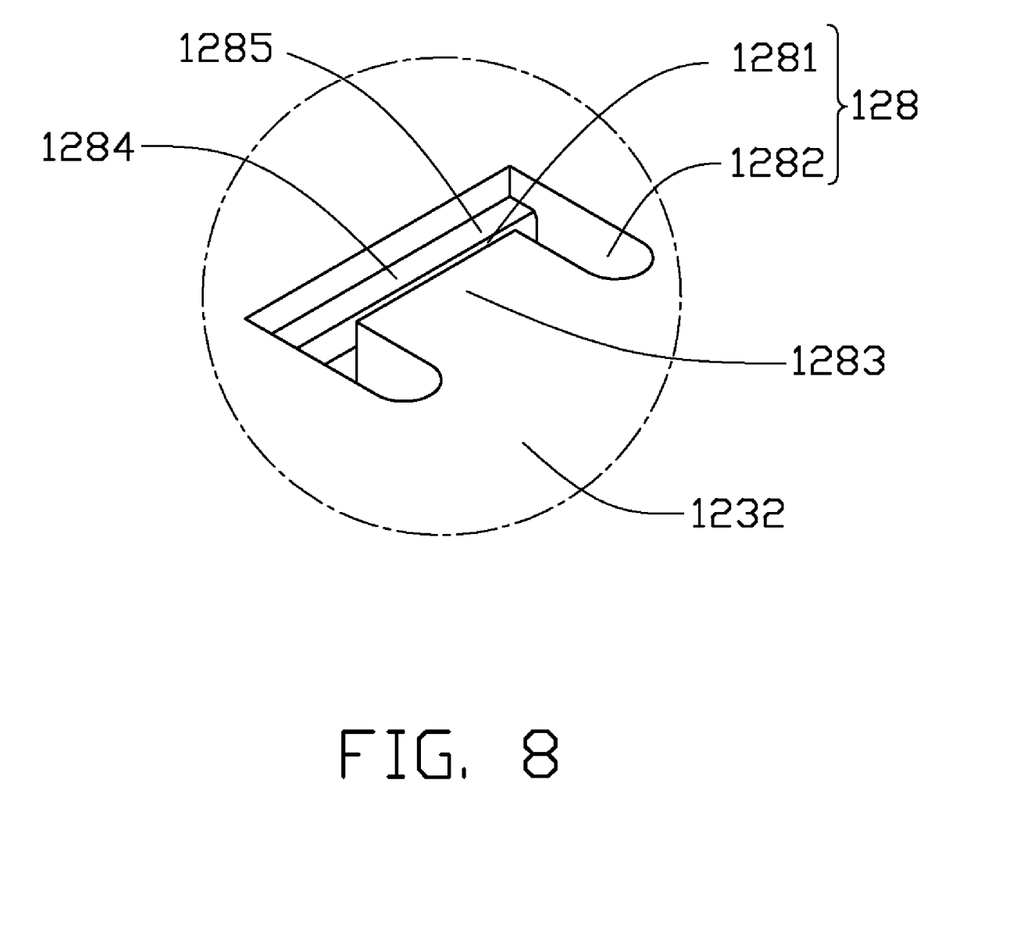
FIG. 8 is a partial enlarged view of the housing assembly in FIG. 2, showing a fourth engaging hole thereof.

Referring to FIGS. 5 and 8, each second engaging hole 128 includes a second positioning slot 1281 and two second accessory holes 1282. The two second accessory holes 1282 communicate with the second locating slot 1281. The two second accessory holes 1282 are symmetric, and a plurality of second warping portions 1283 are formed on the bottom wall 123. The bottom wall 123 has a plurality of second securing grooves 1284 defined therein. Each second securing groove 1284 is located opposite to a second warping portion 1283 and communicates with a second locating slot 1281. Each second securing groove 1284 accommodates portions of the first decorative member 14 therein (Referring to FIG. 11).

The second sidewall 122 of the main body 12 has a plurality of third engaging holes 129 defined therein. Each third engaging holes 129 accommodates the second decorative member 16 therein.

Figure 4:
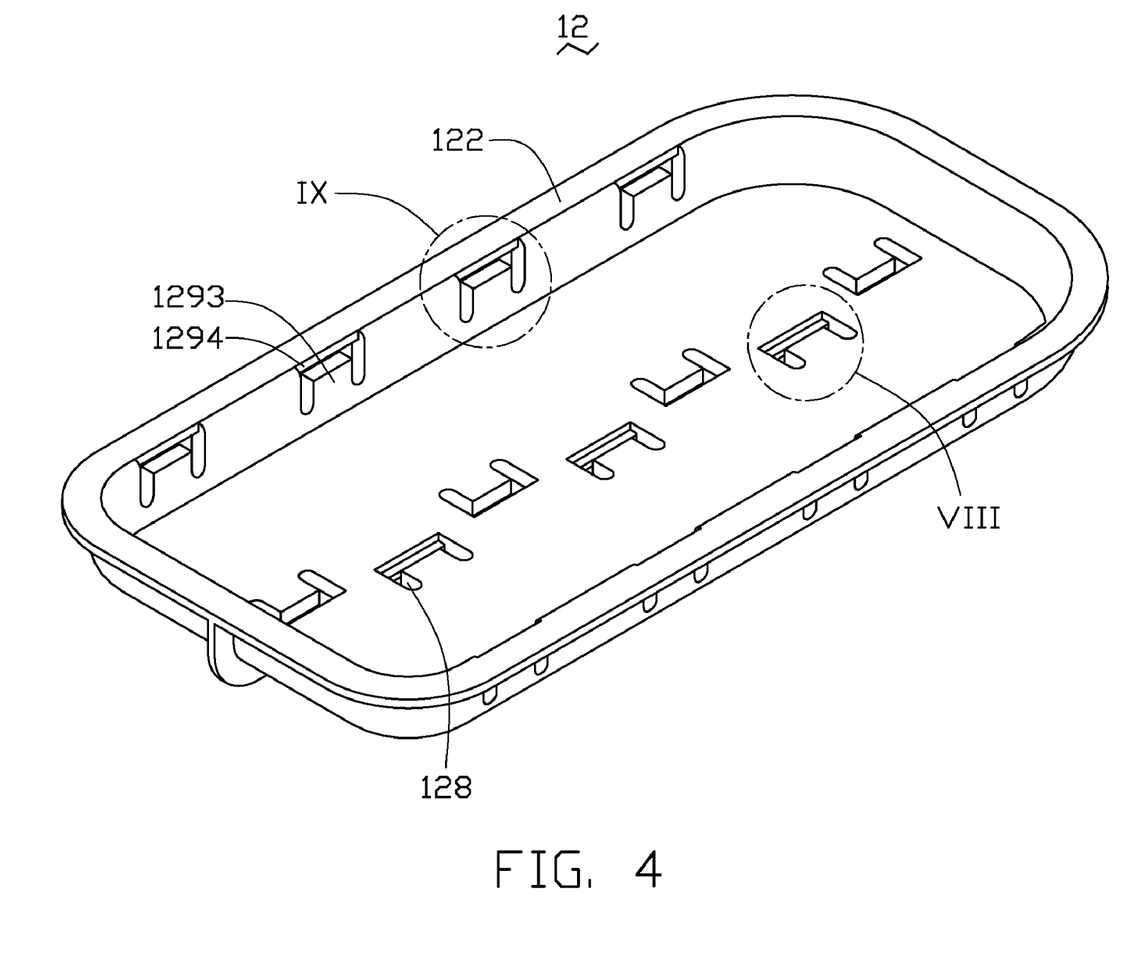
FIG. 4 is a partial enlarged view of the housing assembly in FIG. 2, showing a first engaging hole thereof.
Figure 9:
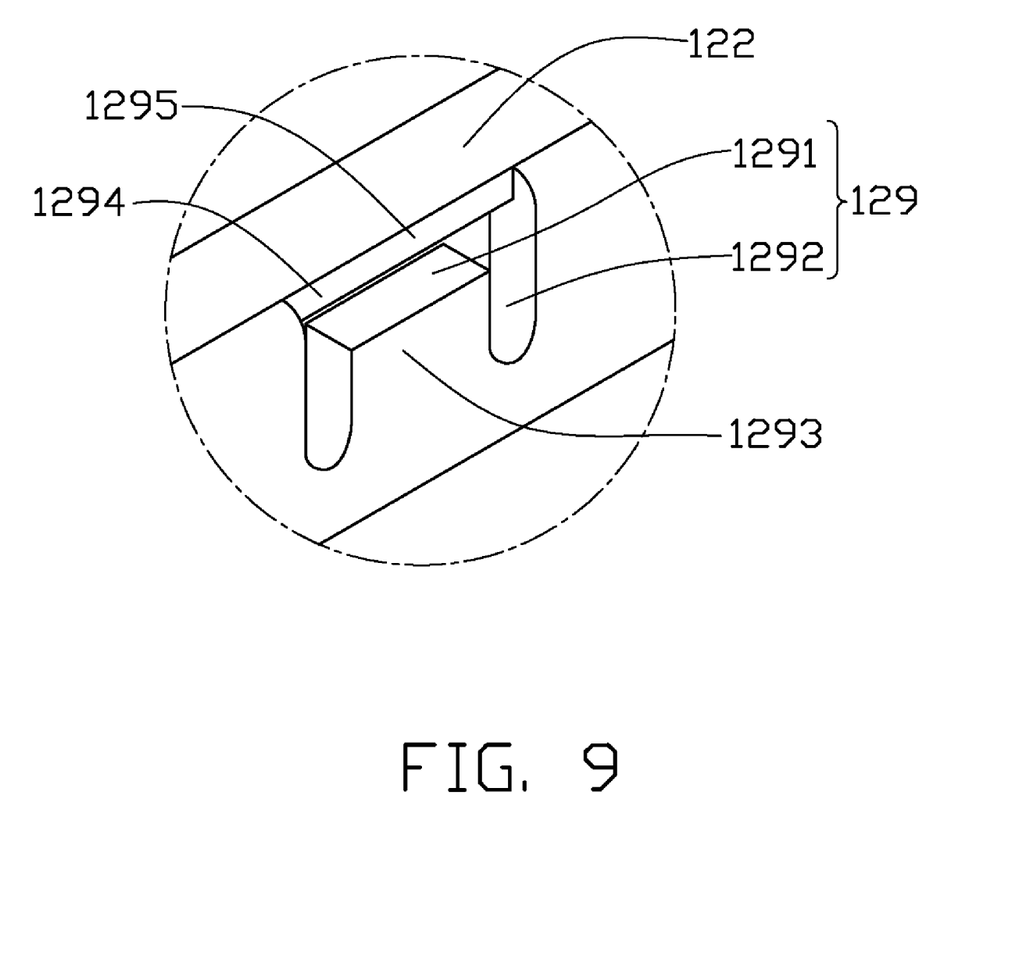
FIG. 9 is an isometric and explored view of the housing assembly in FIG. 2, showing another aspect thereof.

Referring to FIGS. 4 and 9, each of the third engaging holes 129 includes a third locating slot 1291 and two third accessory holes 1292. Each of the two third accessory holes 1292 communicates with a third locating slot 1291. The two third accessory holes 1292 are symmetric, and a plurality of third warping portions 1293 are formed on the second sidewall 122. The second sidewall 122 has a plurality of third securing grooves 1294 defined therein. Each third securing groove 1294 is located opposite to a third warping portion 1293 and communicates with a third locating slot 1291. Each third securing groove 1294 accommodates portions of the second decorative member 16 therein.

The bottom wall 123 of the second housing portion 1234 of the main body 12 has a plurality of fourth engaging holes 130 defined therein. Each fourth engaging hole 130 accommodates portions of the second decorative member 16 therein.

Figure 10:
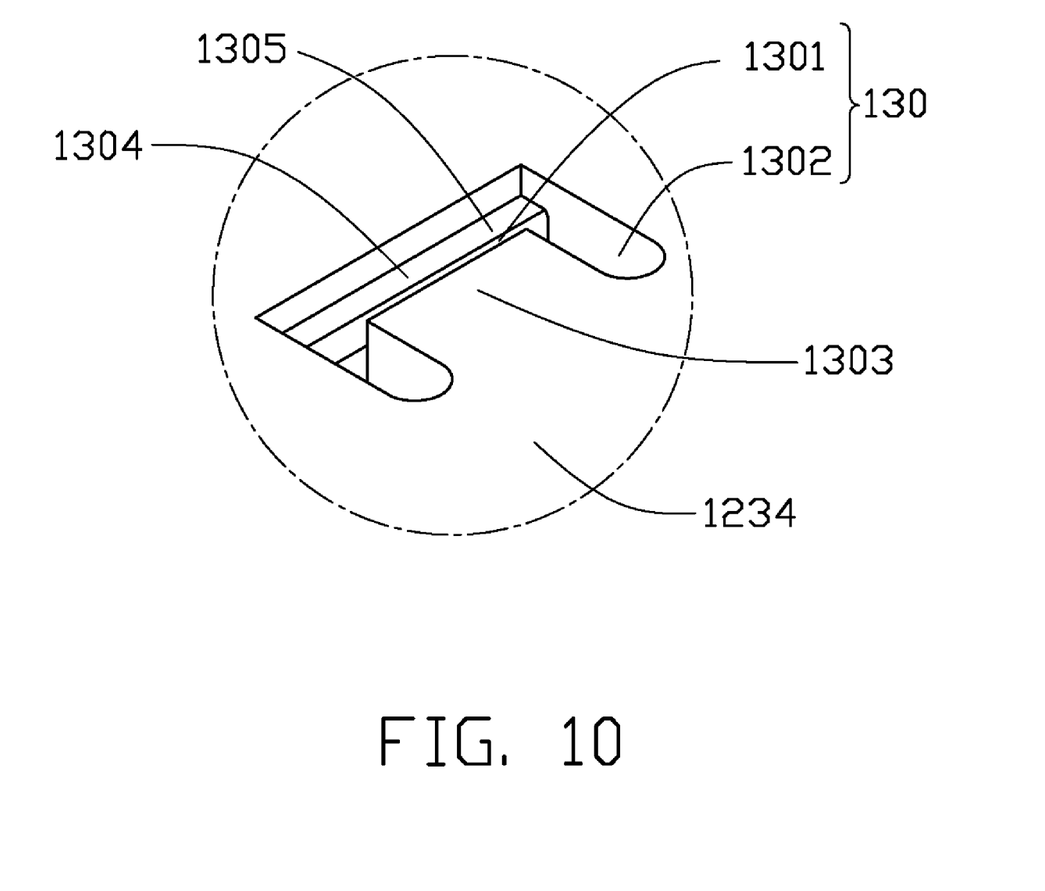
FIG. 10 is an assembled view of the housing assembly shown in FIG. 9.

Referring to FIGS. 4 and 10, each of the fourth engaging holes 130 includes a fourth locating slot 1301 and two fourth accessory holes 1302. Each of the fourth accessory holes 1302 communicate with a fourth locating slot 1301. The two fourth accessory holes 1302 are symmetric to each other, and a pluralities of the fourth warping portion 1303 are formed on the bottom wall 123. The bottom wall 123 has a plurality of fourth securing groove 1304 defined therein. Each fourth securing grooves 1304 is located opposite to a fourth warping portion 1303 and communicates with a fourth locating slot 1301. Each fourth securing groove 1304 accommodates portions of the second decorative member 16.

Figure 7:
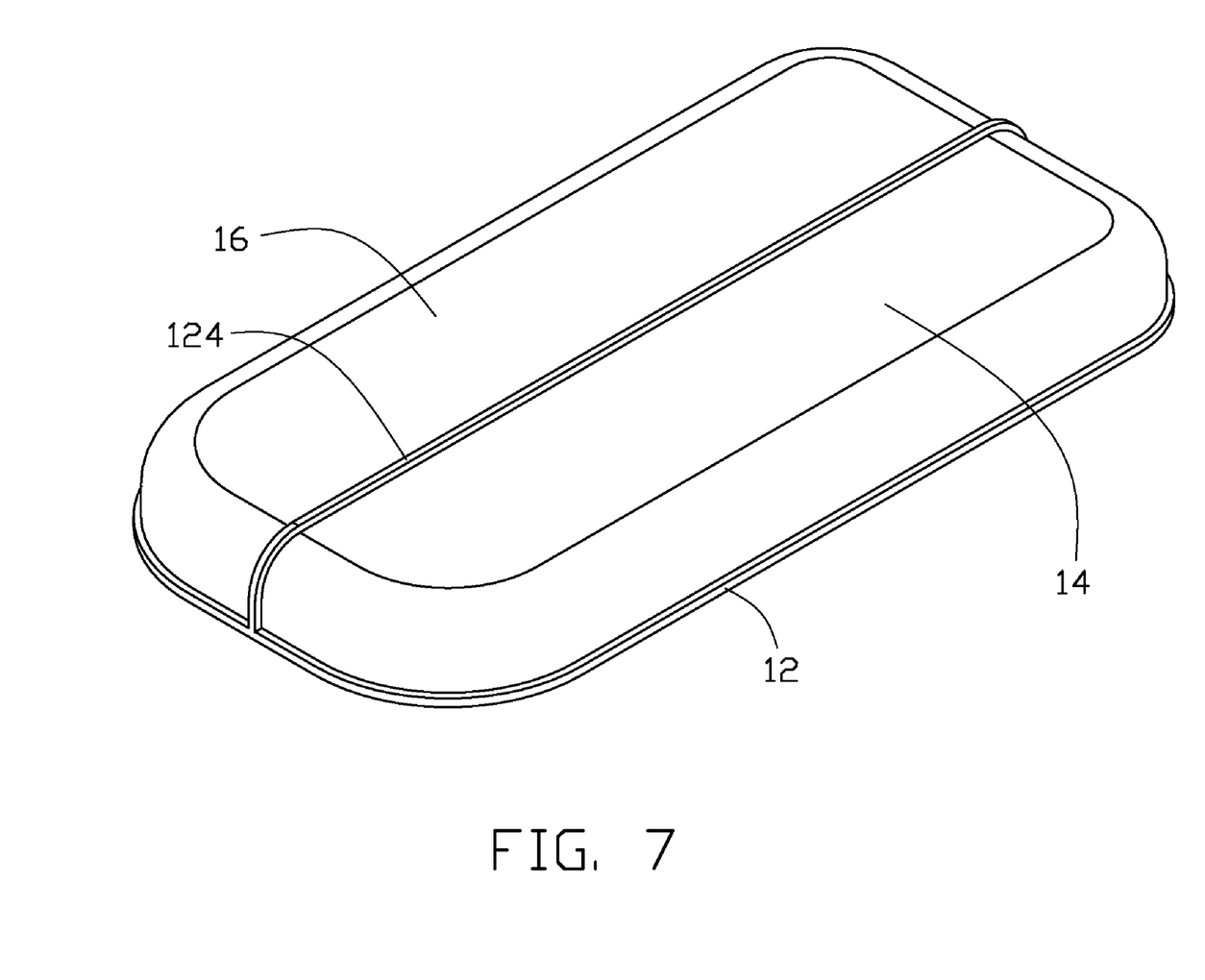
FIG. 7 is a partial enlarged view of the main body in FIG. 5, showing a third engaging hole thereof.

Referring to FIG. 2, the first decorative member 14 has substantially the same shape as that of the first housing portion 1232 with a size larger than the first housing portion 1232. The first decorative member 14 is mounted to the outer wall of the first housing portion 1232, to cover the first housing portion 1232 (Referring to FIGS. 3 and 7).

Referring to FIGS. 2 and 5, the first decorative member 14 includes a first decorative wall 142 and a first attaching wall 144. The first decorative wall 142 is located opposite to the first attaching wall 144.

The first decorative wall 142 is treated/processed by a surface treatment technology, e.g., Non Conductive Vacuum Metallization (NCVM).

The first attaching wall 144 can be attached to the main body 12. The first attaching wall 144 has a plurality of first mating elements 146 and a plurality of second mating elements 148 protruding therefrom.

Each first mating element 146 respectively corresponds to each first engaging holes 127. Each of the first mating elements 146 has a first locating portion 1462 and a first securing portion 1464. One end of the first locating portion 1462 connects to the first attaching wall 144, and the first securing portion 1464 protrudes from the other end of the first locating portion 1462.

The first locating portion 1462 has substantially the same shape and size as that of the first locating slot 1271 viewed in cross section. The first locating portion 1462 is accommodated in the first locating slot 1271 (Referring to FIG. 11).

The first securing portion 1464 protrudes from one side of the first locating portion 1462, and the first securing portion 1464 faces the first securing grooves 1274. The first securing portion 1464 is accommodated in the first securing grooves 1274 and engages with the bottom surface of the first securing grooves 1274 (Referring to FIG. 11).

Each second mating element 148 respectively corresponds to each second engaging hole 128. Each of the second mating elements 148 has a second locating portion 1482 and a second securing portion 1484. One end of the second locating portion 1482 connects to the first attaching wall 144, and the second securing portion 1484 protrudes from the other end of the second locating portion 1482.

The second locating portion 1482 has substantially the same shape and size as the second locating slot 1281 viewed in cross section. The second locating portion 1482 is accommodated in the second locating slot 1281 (Referring to FIG. 11).

The second securing portion 1484 protrudes from one side of the second locating portion 1482, and the second securing portion 1484 faces to the second securing groove 1284. The second securing portion 1484 is accommodated in the second securing groove 1284 and engages with the bottom wall of the second securing groove 1284 (Referring to FIG. 11).

Referring to FIG. 2, the second decorative member 16 is substantially the same shape as the second housing portion 1234 with the size larger than the second housing portion 1234. The second decorative member 16 is mounted to the outer wall of the second housing portion 1234 and covers the second housing portion 1234 (Referring to FIGS. 3 and 7).

Referring to FIGS. 2 and 5, the second decorative member 16 includes a second decorative wall 162 and a second attaching wall 164. The second decorative wall 162 is located opposite to the second attaching wall 164.

The second decorative wall 162 is treated/processed by a differential surface treatment technology from the present surface treatment technology processed on the first decorative wall 142, e.g., processed by paint coating.

The second attaching wall 164 can be attached to the main body 12. The second attaching wall 164 has a plurality of third mating elements 166 and a plurality of fourth mating elements 168 protruding therefrom.

Each third mating element 166 corresponds to each third engaging hole 129. Each of the third mating elements 166 has a third locating portion 1662 and a third securing portion 1664. One end of the third locating portion 1662 connects to the second attaching wall 164, and the third securing portion 1664 protrudes from the other end of the third locating portion 1662.

The third locating portion 1662 is substantially the same shape and size as the third locating slot 1291. The third locating portion 1662 is accommodated in the third locating slot 1291 (Referring to FIG. 11).

The third securing portion 1664 protrudes from one side of the third locating portion 1662, and the third securing portion 1664 faces the third securing groove 1294. The third securing portion 1664 is accommodated in the third securing groove 1294 and engages the bottom wall of the third securing groove 1294 (Referring to FIG. 11).

Each fourth mating element 168 corresponds to each fourth engaging hole 130. Each of the fourth mating elements 168 has a fourth locating portion 1682 and a fourth securing portion 1684. One end of the fourth locating portion 1682 connects to the second attaching wall 164, and the fourth securing portion 1684 protrudes from the other end of the fourth locating portion 1682.

The fourth locating portion 1682 has the shape and the size of the fourth locating slot 1301 view cross section. The fourth locating portion 1682 is accommodated in the fourth locating slot 1301 (Referring to FIG. 11).

The fourth securing portion 1684 protrudes from the side of the fourth locating portion 1682 and face the fourth securing groove 1304. The fourth securing portion 1684 is accommodated in the fourth securing groove 1304 and engages with the bottom surface of the fourth securing groove 1304 (Referring to FIG. 11).

Figure 11:
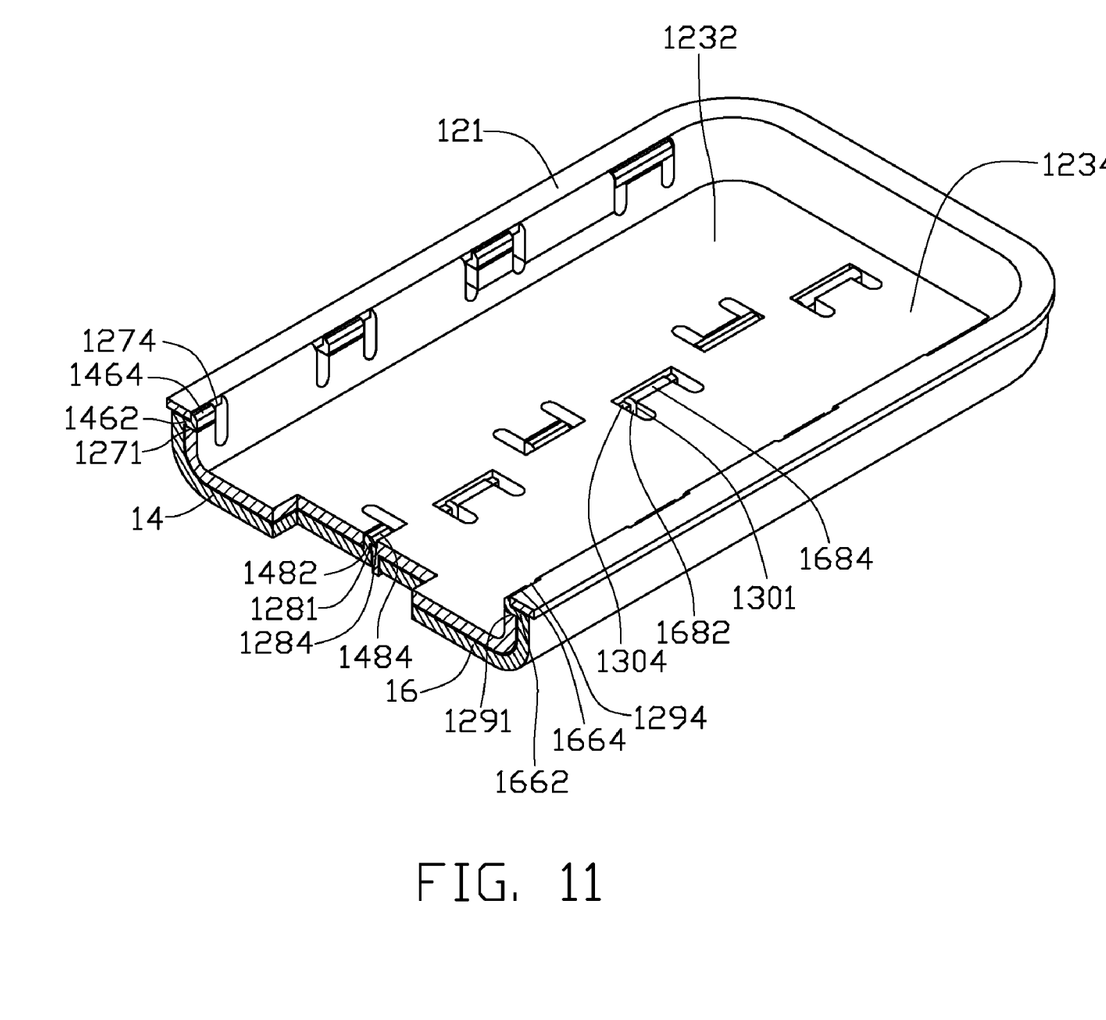
FIG. 11 is a partial sectional view of the housing assembly shown in FIG. 10.

When assembling the housing 10, the first mating element 146 and the second mating elements 148 are aligned with the first engaging holes 127 and the second engaging holes 128, respectively; and then the first decorative member 14 is pressed downwardly towards the main body 12. During this stage, the first securing portions 1464 resist the first warping portions 1273, and the first warping portions 1273 warp as the first decorative member 14 pressed, and the first securing portions 1464 thus respectively pass through the first locating slots 1271 and engage the first securing grooves 1274 for securing to the bottom surface of the securing grooves 1274 (as shown in FIG. 11). Simultaneously, the second securing portions 1484 resist against the second warping portions 1283, and the second warping portions 1283 warp as the first decorative member 14 is pressed downwardly, thus, the second securing portions 1484 passes through the second locating slots 1281 and engage the second securing grooves 1284 for securing with the bottom surface of securing grooves 1284 (as shown in FIG. 11). The first decorative member 14 is thereby mounted to the main body 12 as the first securing portions 1464 are secured to the bottom surface of the first securing grooves 1274 and the second securing portion 1484 is secured to the bottom surface of the second securing grooves 1284. After that, the second decorative member 16 is mounted to the main body 12 in a similar manner as that of the first decorative member 14 being mounted to the main body 12.

It is to be understood, however, that even through numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A housing assembly for use in a portable electronic device, comprising:
   a main body having a plurality of engaging holes defined therein;
   a first decorative member having a first appearance, the first decorative member mounted to a portion of an outer wall of the main body, the first decorative member having a plurality of mating elements; and
   a second decorative member having a second appearance that differs from the first appearance, the second decorative member mounted to another portion of the outer wall of the main body, the second decorative member having a plurality of mating elements;
   wherein the first decorative member and the second decorative member are located side by side, each first or second decorative member's mates element corresponds to an engaging hole, each of the engaging holes comprise a locating slot and two accessory holes communicating with the locating slot; the two accessory holes being on one side of the locating slot, the main body having a securing groove defined on the other side of the locating slot, and the securing groove communicates with the locating slot, each mating element comprising a locating portion and a securing portion, the locating portion disposed in the locating slot, the securing portion disposed in the securing groove and engaging with the bottom surface of the securing groove.

2. The housing assembly as claimed in claim 1, wherein the first decorative member is processed by a first surface treatment, the second decorative member is processed by a second surface treatment, and the first surface treatment differing from the second surface treatment.

3. The housing assembly as claimed in claim 1, wherein the first decorative member is processed by NCVM, and the second decorative member is processed by mica paint.

4. A portable electronic device, comprising:
   a first housing assembly;
   a second housing assembly assembled to the first housing assembly, the first housing assembly comprising:
   a main body having a plurality of engaging holes defined therein;
   a first decorative member having a first appearance, the first decorative member mounted to a portion of an outer wall of the main body, the first decorative member having a plurality of mating elements; and
   a second decorative member having a second appearance that differs from the first appearance, the second decorative member mounted to another portion of the outer wall of the main body, the second decorative member having a plurality of mating elements, the second decorative member located on a different portion of the same outer wall of the housing as the first decorative member;
   wherein each first or second decorative member's mates element corresponding to an engaging hole; each of the engaging holes comprises a locating slot and two accessory holes communicating with the locating slot; the two accessory holes being on one side of the locating slot, the main body having a securing groove defined on the other side of the locating slot, and the securing groove communicates with the locating slot, each mating element comprising a locating portion and a securing portion, the locating portion disposed in the locating slot, the securing portion disposed in the securing groove and engaging with the bottom surface of the securing groove.

5. The housing assembly as claimed in claim 4, wherein the first decorative member is processed by a first surface treatment, the second decorative member is processed by a second surface treatment, and the first surface treatment differing from the second surface treatment.

6. The housing assembly as claimed in claim 4, wherein the first decorative member is processed by NCVM, and the second decorative member is processed by mica paint.

7. The housing assembly as claimed in claim 4, wherein the main body is a case that comprising a first sidewall and a bottom wall, the first sidewall protruding from one end of the bottom wall, the engaging holes comprising a plurality of first engaging holes defined in the first sidewall and a plurality of second engaging holes defined in the bottom wall near the first sidewall, the mating elements comprising a plurality of first mating elements and a plurality of second mating elements protruding from the first decorative member, the first mating elements engaging with the first engaging holes, the second mating elements engaging with the second engaging holes.

8. The housing assembly as claimed in claim 7, wherein the main body has a second sidewall protruding from the other end of the bottom wall, the engaging holes further including a plurality of third engaging holes defined in the second sidewall and a plurality of fourth engaging holes defined in the bottom wall near the second sidewall, the mating elements further comprising a plurality of third mating elements and a plurality of fourth mating elements protruding from the second decorative member, the third mating elements engaging with the third engaging holes, the fourth mating elements engaging with the fourth engaging holes.

9. A housing assembly for use in a portable electronic device, comprising:
   a main body having a plurality of engaging holes defined therein;
   a first decorative member having a first appearance, the first decorative member mounted to a portion of an outer wall of the main body, the first decorative member having a plurality of mating elements; and a second decorative member having a second appearance that differs from the first appearance, the second decorative member mounted to another portion of the outer wall of the main body adjacent to the first decorative member, the second decorative member having a plurality of mating elements;

wherein the first decorative member and the second decorative cooperatively provide decorative effect for the same outer wall of the main body, each first or second decorative member's mating element corresponding to an engaging hole; each of the engaging holes comprises a locating slot and two accessory holes communicating with the locating slot; the two accessory holes being on one side of the locating slot, the main body having a securing groove defined on the other side of the locating slot, and the securing groove communicates with the locating slot, each mating element comprising a locating portion and a securing portion, the locating portion disposed in the locating slot, the securing portion disposed in the securing groove and engaging with the bottom surface of the securing groove.

10. The housing assembly as claimed in claim 9, wherein the first decorative member is processed by a first surface treatment, the second decorative member is processed by a second surface treatment, and the first surface treatment differing from the second surface treatment.

11. The housing assembly as claimed in claim 9 wherein the first decorative member is processed by NCVM, and the second decorative member is processed by mica paint.

12. The housing assembly as claimed in claim 9, wherein the main body is a case that comprising a first sidewall and a bottom wall, the first sidewall protruding from one end of the bottom wall, the engaging holes comprising a plurality of first engaging holes defined in the first sidewall and a plurality of second engaging holes defined in the bottom wall near the first sidewall, the mating elements comprising a plurality of first mating elements and a plurality of second mating elements protruding from the first decorative member, the first mating elements engaging with the first engaging holes, the second mating elements engaging with the second engaging holes.

13. The housing assembly as claimed in claim 12, wherein the main body has a second sidewall protruding from the other end of the bottom wall, the engaging holes further including a plurality of third engaging holes defined in the second sidewall and a plurality of fourth engaging holes defined in the bottom wall near the second sidewall, the mating elements further comprising a plurality of third mating elements and a plurality of fourth mating elements protruding from the second decorative member, the third mating elements engaging with the third engaging holes, the fourth mating elements engaging with the fourth engaging holes.

* * * * *